(12) United States Patent
Carpick et al.

(10) Patent No.: US 9,478,244 B2
(45) Date of Patent: Oct. 25, 2016

(54) METHOD AND MATERIAL FOR PROTECTING MAGNETIC INFORMATION STORAGE MEDIA

(71) Applicant: The Trustees of the University of Pennsylvania, Philadelphia, PA (US)

(72) Inventors: Robert W. Carpick, Philadelphia, PA (US); Kumar Sridharan, Madison, WI (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 44 days.

(21) Appl. No.: 14/486,397

(22) Filed: Sep. 15, 2014

(65) Prior Publication Data

US 2015/0044510 A1  Feb. 12, 2015

Related U.S. Application Data

(63) Continuation of application No. PCT/US2013/030910, filed on Mar. 13, 2013.

(60) Provisional application No. 61/611,894, filed on Mar. 16, 2012.

(51) Int. Cl.
| | |
|---|---|
| G11B 5/66 | (2006.01) |
| G11B 5/72 | (2006.01) |
| C23C 14/06 | (2006.01) |
| C23C 14/32 | (2006.01) |
| C23C 14/34 | (2006.01) |
| C23C 14/48 | (2006.01) |
| C23C 16/32 | (2006.01) |
| C23C 16/448 | (2006.01) |
| C23C 16/50 | (2006.01) |
| G11B 5/84 | (2006.01) |
| C23C 16/30 | (2006.01) |

(52) U.S. Cl.
CPC .......... *G11B 5/722* (2013.01); *C23C 14/0635* (2013.01); *C23C 14/325* (2013.01); *C23C 14/34* (2013.01); *C23C 14/48* (2013.01); *C23C 16/30* (2013.01); *C23C 16/32* (2013.01); *C23C 16/448* (2013.01); *C23C 16/50* (2013.01); *G11B 5/8408* (2013.01)

(58) Field of Classification Search
None
See application file for complete search history.

(56) References Cited

U.S. PATENT DOCUMENTS

| | | | | |
|---|---|---|---|---|
| 5,352,493 | A | * | 10/1994 | Dorfman ............ A61L 27/306 347/62 |
| 5,518,976 | A | | 5/1996 | Itoh et al. |
| 5,728,465 | A | | 3/1998 | Dorfman et al. |
| 5,786,068 | A | | 7/1998 | Dorfman et al. |
| 6,544,627 | B1 | * | 4/2003 | Vijayen ................ C03C 17/22 428/141 |
| 2005/0287333 | A1 | | 12/2005 | Takagi et al. |

(Continued)

OTHER PUBLICATIONS

Dorfman, V.F., "Diamond-like Nanocomposites (DLN)", Thin Solid Films, 212:267-273 (1992).
Bares et al., "Small Amplitude Reciprocating Wear Performance of Diamond-Like Carbon Films: Dependence of Film Composition and Counterface Material", Tribology Letters, 27(1):79-88 (2007).
Duparre et al., "Surface characterization techniques for determining the root-mean-square roughness and power spectral densities of optical components", Applied Optics, 41(1):154-171 (2002).

(Continued)

*Primary Examiner* — Holly Rickman
(74) *Attorney, Agent, or Firm* — Baker Botts L.L.P.

(57) ABSTRACT

A method of protecting a magnetic information storage medium is described. The method includes fabricating a film over a surface of the magnetic information storage medium. The film includes an amorphous, uniform, homogeneous solid solution of carbon, hydrogen, silicon, and oxygen. A magnetic storage medium with such a protective film is described.

22 Claims, 5 Drawing Sheets

(56) References Cited

U.S. PATENT DOCUMENTS

| | | |
|---|---|---|
| 2006/0063040 A1 | 3/2006 | Ishiyama et al. |
| 2008/0187781 A1 | 8/2008 | Cheng et al. |
| 2009/0176035 A1 | 7/2009 | Tudhope et al. |
| 2009/0231747 A1 | 9/2009 | Matsumoto et al. |
| 2009/0316289 A1* | 12/2009 | Okura ............... G11B 5/72 360/59 |
| 2010/0129686 A1 | 5/2010 | Furuta et al. |
| 2012/0045592 A1 | 2/2012 | Kumar et al. |

OTHER PUBLICATIONS

Mekinis et al., "Dielectric properties of the Ion beam deposited SiOx doped DLCFilms", Materials Science (Medziagotyra), 15(1): 3-6 (2009).

* cited by examiner

METHOD AND MATERIAL FOR PROTECTING MAGNETIC INFORMATION STORAGE MEDIA

CROSS REFERENCE TO RELATED APPLICATIONS

This application claims the benefit of U.S. provisional application No. 61/611,894 filed Mar. 16, 2012, the contents of which are hereby incorporated by reference as if fully set forth herein.

FIELD

This application is in the field of materials and fabrication of materials. In particular, it is directed to materials used in magnetic information storage.

BACKGROUND

Magnetic storage media, such as hard disks, store information in the form of magnetization of a magnetic material. A write head creates a magnetic field that magnetizes the magnetic material over a small area. A bit of information is represented by a property of the magnetized area, such as the direction of magnetization, for example. Magnetization in one direction may represent a binary "1" while magnetization in a different direction may represent a binary "0". A read head detects the value of the stored bit by sensing such differences in the magnetization.

A protective layer, or overcoat, may be used to protect the magnetic material from mechanical damage and chemical corrosion. Without such a protective layer, the magnetic material may be damaged, and information lost, if, for example, a head crashes into the magnetic material or if the material oxidizes from exposure to air and moisture.

There is a constant effort to increase the information storage density of magnetic recording media by decreasing the area needed to store a single bit of information. As this area is decreased, however, numerous challenges arise. Because of the geometry and physics of magnetic recording, as this storage area is made smaller, the thickness of the protective layer must be decreased while its mechanical and chemical integrity are maintained. In addition, as the storage area is made smaller, the energy required to change the magnetization of the magnetic material may decrease to a point where thermal agitation at room temperature is enough to disrupt the magnetization, and the stored information is lost. This problem may be avoided by increasing the coercivity of the material—essentially the strength of magnetic field needed to magnetize the material and store a bit. The problem is, for the smaller desired storage areas, a write head may not be able to produce the required larger magnetic field magnitudes while still functioning as needed to store information.

A proposed solution to these challenges is heat-assisted magnetic recording (HAMR). In this technique, the small area of the magnetic material in which information is to be stored is momentarily heated to a temperature well above room temperature, such as 150 degrees Celsius (° C.) or higher. This may be done, for example, with a focused pulsed laser as a heat source. While the storage area is maintained at this elevated temperature the magnetizing field is applied and the material is magnetized so as to represent a desired bit value. Once the bit is stored, the heat source is turned off. The material then rapidly cools back to room temperature and the magnetization is "locked in", thus storing the bit value.

The use of HAMR presents new challenges for the protective layer. The material of the protective layer must withstand the elevated temperatures used in HAMR without losing its mechanical and chemical integrity needed to protect the magnetic material. At the same time, the protective layer must be thin enough to allow robust, durable magnetic storage. Materials currently in use for protective layers in magnetic storage media, such as hydrogenated amorphous carbon (a-C:H) do not meet these requirements.

SUMMARY

A method of protecting a magnetic information storage medium includes fabricating a film over a surface of the magnetic information storage medium. The film includes an amorphous, uniform, homogeneous solid solution of carbon, hydrogen, silicon, and oxygen. A magnetic storage medium is protected with such a film.

DETAILED DESCRIPTION OF THE EMBODIMENTS

Silicon oxide-doped diamondlike carbon (SiO-DLC) may be used as protective overcoat material in magnetic information storage media, including media for heat-assisted magnetic recording (HAMR), in devices such as hard disk drives (HDDs). SiO-DLC is a completely uniform, homogeneous solid solution of carbon, hydrogen, silicon, and oxygen in a fully amorphous form. SiO-DLC films may deposited on various substrates with thicknesses as low as 1 nanometer (nm). These films have been shown to be uniform at the atomic level throughout the thickness. They have also been shown to maintain their atomic-level structure and composition when heated up to 300 degrees Celsius (° C.). Such films are thus promising candidates for protective overcoats on magnetic storage media used for HAMR.

Figure 1:
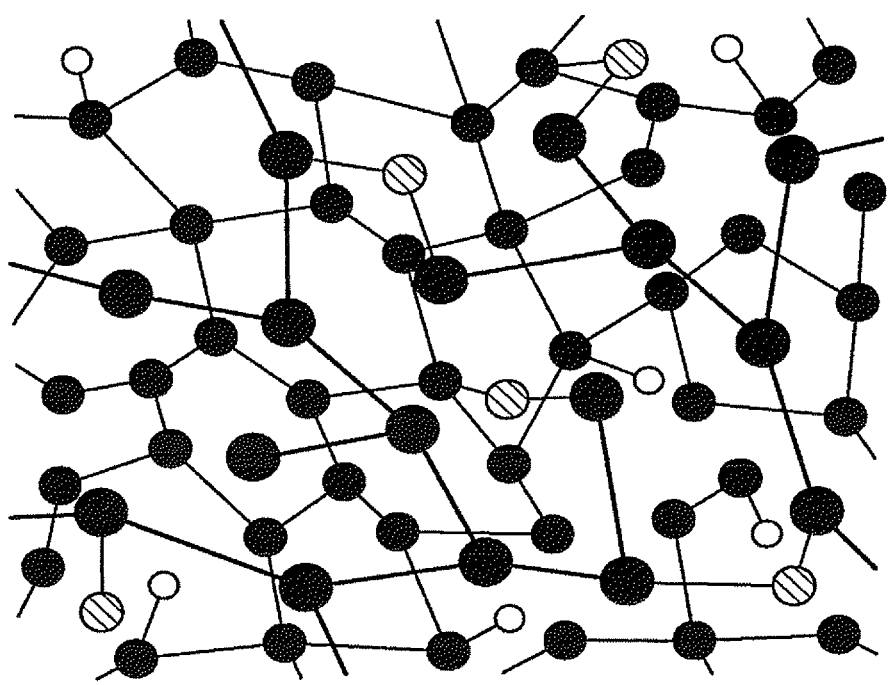
FIG. 1 shows atomic level structure of SiO-DLC.

FIG. 1 shows the atomic structure of SiO-DLC. It contains no nanoparticles, precipitates, or segregated phases, and thus exhibits atomically smooth surfaces and interfaces. These are crucial requirements for magnetic information storage media such as HAMR overcoats. Some suggest viewing SiO-DLC conceptually as consisting of two networks of hydrogenated amorphous carbon (a-C:H; or diamond-like carbon—DLC) and silica glass (SiOx) that are fully interpenetrating down to the atomic level. Thus, SiO-DLC is sometimes referred to in the technical literature as diamond-like nanocomposite (DLN). However, it is important to note that the term "nanocomposite" is in fact misleading because there is only one uniform phase present—a complete solid solution of C, H, Si, and O. The term DLN was used for this and closely related materials by B. Dorfman et at in the following patents and article, all of which are hereby incorporated by reference as if fully set forth herein: U.S. Pat. Nos. 5,728,465; 5,352,493; 5,786,068; and 5,518,976; and *Thin Solid Films,* 212 (1992) 267-273.

SiO-DLC possesses multiple beneficial properties compared to a-C:H films (currently the most commonly used material for protective overcoats on HDDs) that renders it ideal for HAMR HDDs and other magnetic information storage media. SiO-DLC may be produced using multiple chemical vapor deposition (CVD) and ion beam methods, including, but not limited to, plasma-enhanced chemical vapor deposition (PECVD), filtered cathodic arc, facing-target sputtering, and plasma immersion ion implantation and deposition (PIIID). The latter method is also known as plasma source ion implantation (PSII).

SiO-DLC is commercially available (Sulzer-Metco) with high uniformity and reliability for various industrial coating applications. It is not available, however, in the thicknesses of a few nanometers needed for some magnetic storage technologies, such as HAMR.

Disclosed here is a method for depositing an SiO-DLC film as thin as 2 nm or less using a process compatible with magnetic information storage media. The SiO-DLC structure and composition may be "tuned" by changing deposition conditions, and SiO-DLC can be doped with metal ions to enhance its electrical conductivity. It is thus possible to substantially modify SiO-DLC films as needed for specific applications. Useful compositional ranges include, in atoms/cm$^3$, approximately:

[C]=(2-10)×10$^{22}$;
[H]=(0.1-0.75)[C];
[Si]=(0.5-2.0)×10$^{22}$;
[O]=(0.2-1.0)[Si].

Bulk and surface properties of SiO-DLC films making such films suitable as protective films for magnetic information storage media such as HAMR HDD include high Young's modulus and hardness, low friction and wear across a broad range of environments (a feature that a-C:H films lack), low residual stress, low adhesion to other materials, and ultrasmooth, chemically inert surfaces. Numerical values for these properties are displayed in Table I for both a-C:H and SiO-DLC.

TABLE I

| Property | a-C:H | SiO-DLC |
| --- | --- | --- |
| Young's Modulus | 50-150 GPa | 100-160 GPa |
| Hardness | 10-16 GPa | 10-20 GPa |
| Degradation Temperature | 150° C. (loss of H, sp$^3$→sp$^2$) | >300° C. |
| Friction coefficient, μ, humid | 0.1-0.5 | 0.04-0.06 |
| Friction coefficient, μ, dry, measured at high contact pressures (>1 GPa) in air | 0.001-0.01 | 0.01-0.03 |
| C hybridization | 30-50% sp$^3$ | uncertain |
| H content | 30-50 at. % | 30-50 at. % |
| Oxidation resistance | Low | High |

In addition to the properties displayed in Table I, a friction coefficient of 0.005 has been measured for an SiO-DLC film in pure partial pressures of $O_2$ or $H_2$. It is believed that this is the lowest friction coefficient currently recorded for an SiO-DLC film.

SiO-DLC has much higher thermal stability compared to conventional a-C:H films, meaning that SiO-DLC resists graphitization and oxidation to a greater extent than does conventional a-C:H. Oxidation resistance at elevated temperature is rare amongst carbon-based materials. Indeed, a-C:H films suffer from limitations that render them unsuitable for HAMR. For example, at temperatures as low as 150° C., H atoms are liberated from an a-C:H matrix, destabilizing the film. Even hydrogen-free amorphous carbon films have multiple thermal degradation pathways including conversion of sp$^3$ to sp$^2$ bonds to form a weaker matrix (due to lower coordination), and burning of C in oxygen-containing environments by the formation of volatile C—O species.

Figure 2:
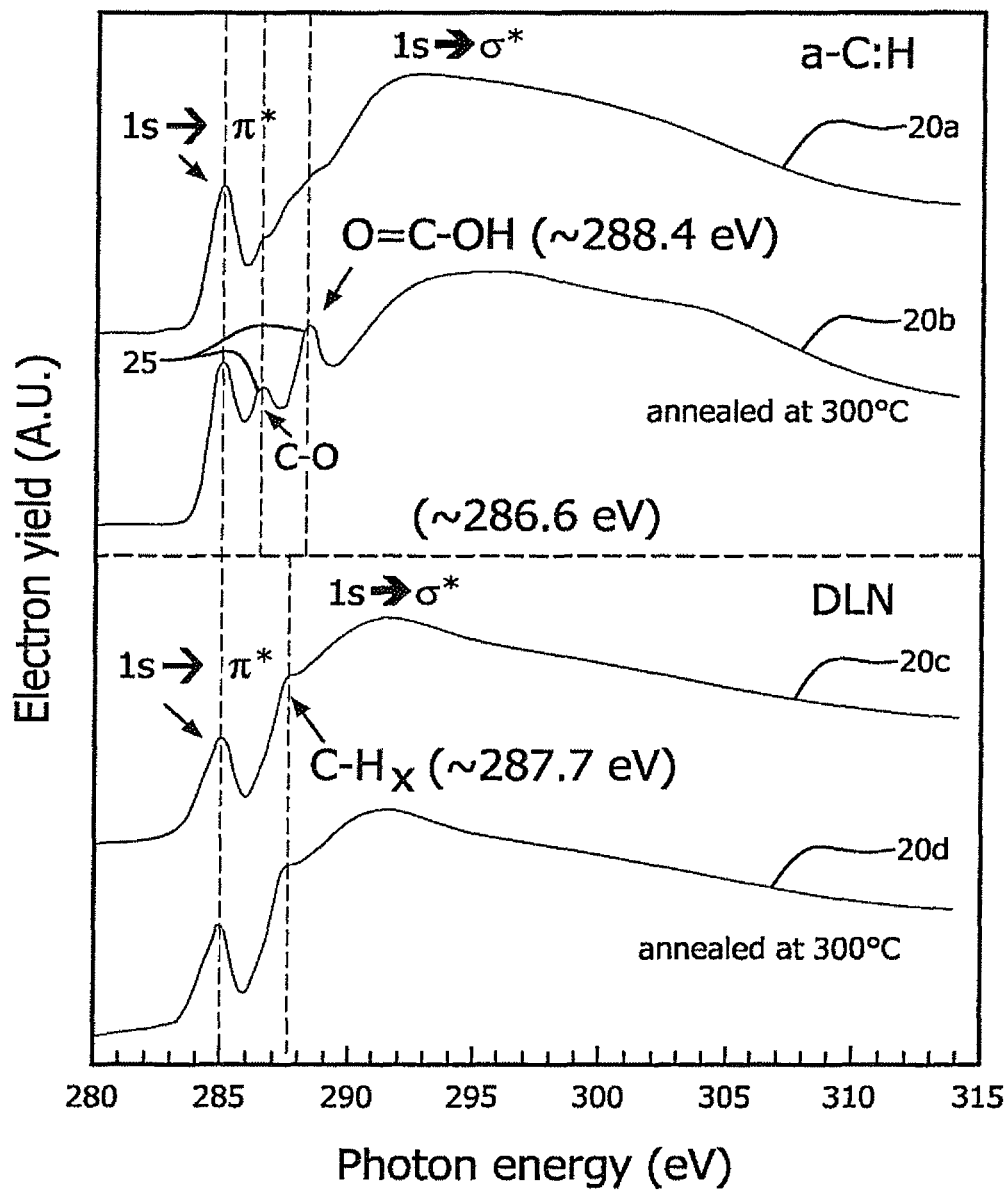
FIG. 2 is a plot showing the thermal stability of two materials.

By contrast, by forming SiO-DLC, which is a solid solution containing hydrogen, carbon, oxygen, and silicon (H, C, O, and Si, respectively), many of the limitations of phase-pure a-C:H films are overcome, while important desired properties (low temperature growth, smooth films, high modulus and hardness) are preserved. At least three factors account for the superior properties of SiO-DLC compared to a-C:H. First, the Si and O allow more structural degrees of freedom enabling SiO-DLC to adopt a more stable structure with lower residual stress. Second, some Si atoms covalently bond with C in the film, forcing a higher level of tetrahedral bonds which are stronger and more stable than the sp$^2$-hybridized C. Third, saturation of the matrix with O renders SiO-DLC kinetically and thermodynamically resistant to further oxidation. Evidence for these differences between SiO-DLC and a-C:H is shown in FIG. 2. Curves 20*a*, 20*b*, 20*c*, and 20*d* are Near Edge X-ray Absorption Fine Structure (NEXAFS) spectra. Curves 20*a* and 20*b* show spectra for a-C:H before and after annealing in air at 300° C., respectively. Curves 20*c* and 20*d* show, respectively, the same spectra for SiO-DLC (labeled as DLN). The higher σ* vs. π* spectral density ratio shows that the as-grown SiO-DLC has more tetrahedral spa-bonded carbon than the a-C:H, and is therefore stronger. In addition, the appearance of peaks 25 in the spectrum 20*b* of a-C:H following the anneal demonstrates oxidation of the film. By contrast, the absence of a corresponding peak in curve 20*d* demonstrates lack of oxidation of the SiO-DLC film following anneal. FIG. 2 provides evidence that, in contrast to a-C:H films, a SiO-DLC film maintains sufficient density and sufficient hardness to protect a magnetic information storage medium from corrosion and wear at all temperatures up to and including at least 300 degrees Celsius. Also, in contrast to a-C:H films, a SiO-DLC film maintains sufficient density and sufficient hardness and, additionally, maintains sufficient resistance to corrosion (oxidation) to protect a magnetic information storage medium at all temperatures up to and including at least 300 degrees Celsius in the presence of oxygen. Furthermore, it may be shown that a SiO-DLC film maintains sufficient thickness to protect a magnetic information storage medium from corrosion and wear at all temperatures up to and including at least 300 degrees Celsius.

It is expected that SiO-DLC films maintain such sufficient density, sufficient hardness, sufficient thickness and sufficient resistance to corrosion at all temperatures up to and including at least 600 degrees Celsius, with or without the presence of oxygen.

These physical phenomena and the resulting film properties are not dependent on the growth method. Indeed, SiO-DLCs can be grown using different methods with a range of precursor gas compositions, including plasma-enhanced chemical vapor deposition (PECVD). Ion beam methods may also be used, and Si-doped DLC has been successfully grown using sputtering. Another method is the plasma immersion ion implantation and deposition (PIIID) process. PIIID SiO-DLC films have been grown and have been shown to be smooth, conformal, and shown to have macro- and nanotribological properties desirable for HAMR HDD protective films. These results are described in the following two documents, which are hereby incorporated by reference as if fully set forth herein:

J. A. Bares, A. V. Sumant, D. S. Grierson, R. W. Carpick & K. Sridharan, *Small Amplitude Reciprocating Wear Performance of Diamond-Like Carbon Films: Dependence of Film Composition and Counterface Material*. Tribol. Lett., 27, 79-88 (2007).

D. S. Grierson, *Nanotribological Properties of Nanostructured Hard Carbon Thin Films*. Ph.D. Thesis, University of Wisconsin-Madison. (2008)

In an embodiment, not to be considered limiting, SiO-DLC films may be grown using PIIID with Hexamethyldisiloxane $(CH_3)_3$—Si—O—Si—$(CH_3)_3$(HMDSO) as a precursor gas. Films may be deposited at a pressure from about 6 millitorr to about 15 millitorr, inclusive, including any pressure within this range. Alternatively, films may be deposited at a pressure from about 6 millitorr to about 25 millitorr, inclusive, including any pressure within this range. Voltage pulses in a range from about negative 3000 Volts DC to about negative 7000 Volts DC, inclusive, including any voltage within this range, may be applied to the sample stage, relative to the vacuum chamber. Alternatively, voltage pulses in a range from about negative 3000 Volts DC to about negative 10000 Volts DC, inclusive, including any voltage within this range, may be applied to the sample stage, relative to the vacuum chamber. Other precursor gasses that may be used include silane-based gases with added oxygen with addition of hydrocarbon gases such as methane or acetylene. As described hereinafter, films 1-2 nm thick have been successfully grown using such growth conditions on various substrates and the films have been shown to be continuous throughout their thickness, down to the substrate itself.

Atomic force microscope (AFM) tips have been fabricated out of SiO-DLC, demonstrating an extremely low wear rate, substantially better than a-C:H tips. Thermal stability of SiO-DLC has been shown to be superior to that of a-C:H films when annealed in the presence of oxygen, such as air at 300° C. This has been demonstrated using near-edge x-ray absorption fine structure (NEXAFS) spectroscopy, which is sensitive to local bonding, including the hybridization state of carbon. As described above in connection with FIG. 2, NEXAFS showed that SiO-DLC has a higher fraction of $sp^3$-hybridized (tetrahedral) C than a-C:H films to begin with. While the a-C:H films show conversion from $sp^3$ to $sp^2$ hybridization (graphitization) as well as oxidation, the SiO-DLC was unchanged after annealing in air.

For conventional DLC, an overcoat thickness of ~2 nm is required to at least prevent corrosion. A non-limiting example of a method for depositing such an overcoat film composed of SiO-DLC is as follows. Start with a hard disk including a structural substrate and magnetic medium. Coat the hard disk with a 1-2 nm thick SiO-DLC using, for example, a hot filament chemical vapor deposition (HFCVD), plasma immersion ion implantation and deposition (PIIID), or filtered cathodic arc (f-CVA) methods.

Figure 3:
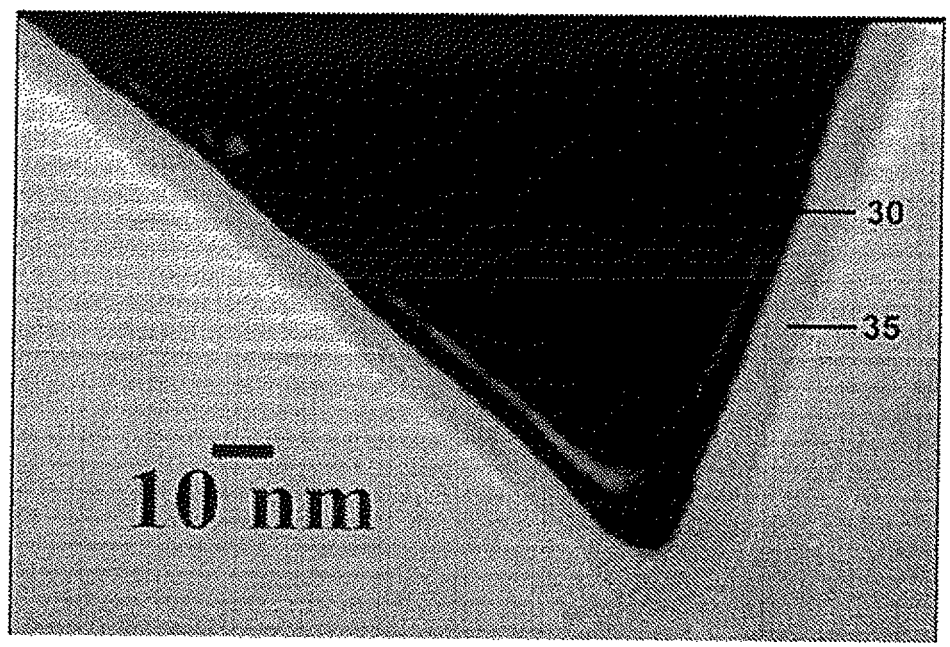
FIG. 3 shows an SiO-DLC film of approximately 10 nanometers thickness.

Using growth conditions described hereinbefore, films 1-2 nm thick have been successfully grown on various substrates and the films have been shown to be continuous throughout their thickness, down to the substrate itself. Specifically, cross-sectional TEM images of 5 nm thick films show no observable change in structure through the entire thickness. An example of an SiO-DLC film is shown in FIG. 3. FIG. 3 is transmission electron micrograph of a commercial silicon tip 30 for atomic force microscopy. The tip 30 has been coated with SiO-DLC using PIIID. The SiO-DLC coating 35 has a thickness of approximately 10 nanometers. Conformal coverage, continuity, and homogeneity throughout the thickness of SiO-DLC coating 35, even at this small scale, are visible in FIG. 3. The film is continuous and homogeneous throughout the thickness, all the way to the tip 30. Films having a root-mean-square roughness of less than 0.1 nm over any area of at least 100 square micrometers have been prepared.

The HFCVD, PIIID, and f-CVA methods have been shown to be capable of large area deposition needed for HDDs. Large diameter (>300 mm) semiconductor wafers have been coated with this method, an area of over 70000 square millimeters. Thicker PIIID films of SiO-DLC have been verified to be pinhole-free based on corrosion tests. SiO-DLC adhesion to a wide range of substrates is known to be very good, as it has low stress (and will be lower for thinner films). No delamination of 5-10 nm thick films coated onto highly curved AFM tips subjected to high (GPa) normal and shear stresses has been observed. Furthermore, if adhesion proves to be a problem, an adhesion-promoting implantation layer can be incorporated into the SiO-DLC growth.

For all of the above reasons, SiO-DLC may be used as an overcoat material for magnetic information storage media such as HAMR-based HDD's. SiO-DLC may be superior to conventional a-C:H coatings since SiO-DLC's known resistance to oxidation and oxygen diffusion may enable the overcoat thickness to be reduced to the range of ~1 nm, thus permitting reduction of the head-disk media spacing. Therefore, it may also be possible to use this as a coating for existing conventional hard drives, boosting their performance.

Figure 4:
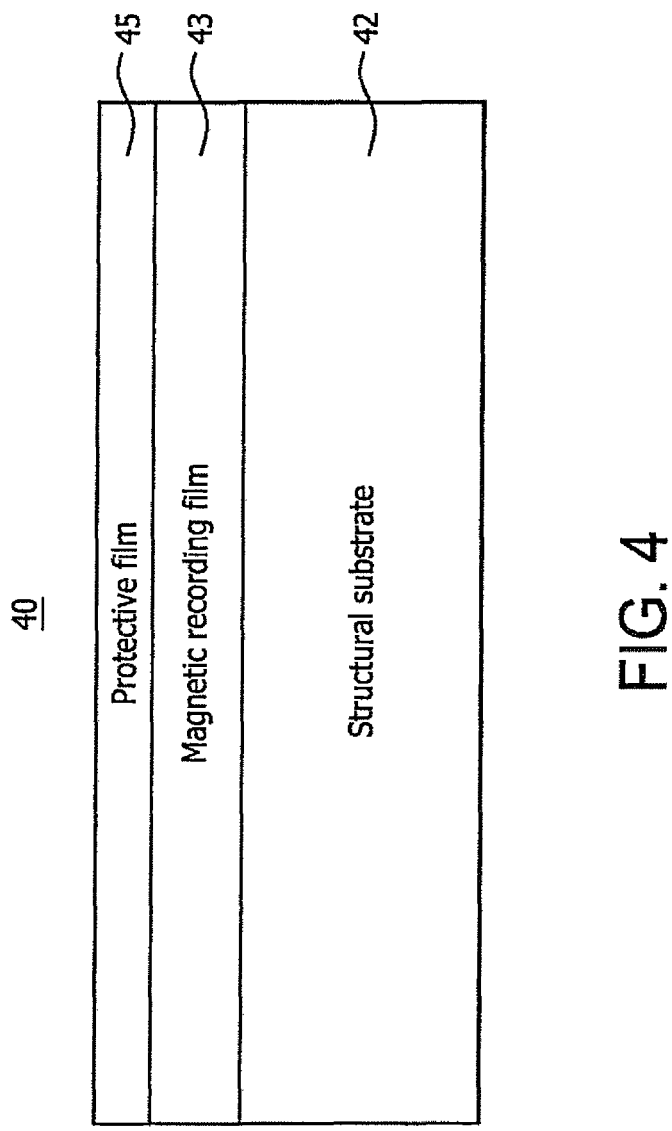
FIG. 4 shows an embodiment of a magnetic recording medium.

FIG. 4 shows an example of a cross-section of a magnetic storage medium 40 such as a hard disk drive. The thicknesses of the various layers shown are not drawn to scale. A structural substrate 42 provides overall mechanical integrity. A recording film 43 is situated on the structural substrate 42. The recording film 43 comprises a magnetic material configured to store information using magnetization. Situated on the recording film 43 is a protective film 45 comprising an amorphous, uniform, homogeneous solid solution of carbon, hydrogen, silicon, and oxygen. The protective film 45 may have an average thickness between 1 and 10 nanometers, inclusive. The protective film 45 may comprise SiO-DLC. The protective film 45 maintains sufficient density, sufficient hardness, sufficient thickness, and sufficient resistance to corrosion to protect the recording film 43 from corrosion and wear at all temperatures up to and including at least 300 degrees Celsius, with or without the presence of oxygen.

The protective film 45 may maintain sufficient density, sufficient hardness, sufficient thickness, and sufficient resistance to corrosion to protect the recording film 43 from corrosion and wear at all temperatures up to and including at least 600 degrees Celsius, with or without the presence of oxygen.

Figure 5:
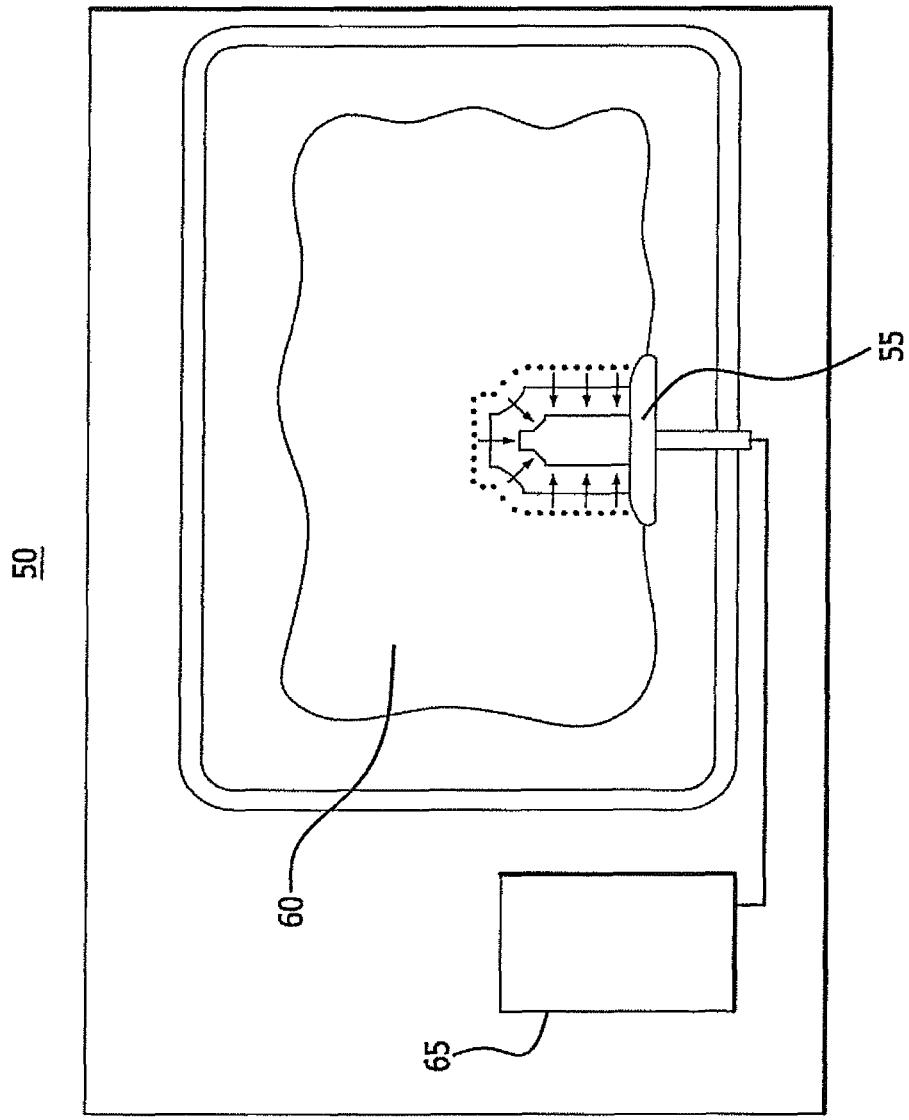
FIG. 5 shows an example of a thin-film deposition apparatus.

FIG. 5 shows an example of apparatus 50 for fabricating films using the method of PIIID, also known as plasma source ion implantation (PSII). A target 55, such as a hard disk, is immersed in a processing plasma 60. Negative high voltage pulses generated by a pulser 65 are applied to the target 55. The negative voltage pulses accelerate positive ions in the plasma toward the target 55 and these ions are implanted into a growing film on the target 55 over the whole area of the target 55 simultaneously. In this way, films may be grown having compositions that are not attainable using other plasma film deposition methods.

While the preceding description refers to certain embodiments, it should be recognized that the description is not limited to those embodiments. Rather, many modifications and variations may occur to a person of ordinary skill in the art which would not depart from the scope and spirit defined in the appended claims.

What is claimed is:

1. A method of protecting a magnetic information storage medium comprising: fabricating a single layer protective film in direct contact with a magnetic recording film of a storage medium, wherein the protective film comprises an amorphous, uniform, homogeneous solid solution of carbon, hydrogen, silicon, and oxygen and wherein the protective film has an average thickness between 1nanometer and 10nanometers, inclusive, in any multiple of 0.1nanometer.

2. The method of claim 1, wherein fabricating a film comprises using plasma immersion ion implantation and deposition (PIIID).

3. The method of claim 1, wherein fabricating a film comprises using a deposition method comprising at least one of plasma-enhanced chemical vapor deposition (PECVD), filtered cathodic arc (f-CVA), facing target sputtering, or hot filament chemical vapor deposition.

4. The method of claim 1, wherein fabricating a film comprises creating a film comprising silicon oxide-doped diamond-like carbon (SiO-DLC).

5. The method of claim 1, wherein fabricating a film comprises fabricating a film having a thickness less than 6nanometers with uniform structure and composition throughout the 6nanometer thickness.

6. The method of claim 1, wherein fabricating a film comprises fabricating a film having a thickness less than or equal to 2nanometers with uniform structure and composition throughout the 2nanometer thickness.

7. The method of claim 1, wherein fabricating a film comprises fabricating a film having a root-mean-square roughness of less than 0.1nanometer over any area of at least 100square micrometers.

8. The method of claim 1, wherein fabricating the film comprises fabricating a film that maintains sufficient density, sufficient hardness, and sufficient thickness to protect the magnetic information storage medium from corrosion and wear at all temperatures up to and including at least 300degrees Celsius.

9. The method of claim 1 wherein fabricating the film comprises fabricating a film that maintains sufficient density, sufficient hardness, sufficient thickness, and sufficient resistance to corrosion to protect the magnetic information storage medium from corrosion and wear at all temperatures up to and including at least 300degrees Celsius in the presence of oxygen.

10. The method of claim 1, wherein fabricating a film comprises fabricating a film in which the structure, composition, and thickness are substantially unchanged over an area up to 3square meters.

11. A magnetic storage medium, comprising:
a structural substrate:
a recording film on the structural substrate, the recording film comprising a magnetic material configured to store information using magnetization; and
a single layer protective film in direct contact with the recording film, the protective film comprising an amorphous, uniform, homogeneous solid solution of carbon, hydrogen, silicon, and oxygen wherein the film has an average thickness between 1nanometer and 10nanometers, inclusive, in any multiple of 0.1nanometer.

12. The magnetic storage medium of claim 11, wherein the protective film comprises a film fabricated using plasma immersion ion implantation and deposition (PIIID).

13. The magnetic storage medium of claim 11 wherein the protective film comprises a film fabricated using a deposition method comprising at least one of plasma-enhanced chemical vapor deposition (PECVD), filtered cathodic arc (f-CVA), facing target sputtering, or hot filament chemical vapor deposition.

14. The magnetic storage medium of claim 11, wherein the protective film comprises silicon oxide-doped diamond-like carbon (SiO-DLC).

15. The magnetic storage medium of claim 11, wherein the protective film has a thickness less than 6nanometers with uniform structure and composition throughout the 6nanometer thickness.

16. The magnetic storage medium of claim 11, wherein the protective film has a thickness less than or equal to 2nanometers with uniform structure and composition throughout the 2nanometer thickness.

17. The magnetic storage medium of claim 11, wherein the protective film has a root-mean-square roughness of less than 0.1nanometer over any given area of at least 100square micrometers.

18. The magnetic storage medium of claim 11, wherein the protective film maintains sufficient density, sufficient hardness, and sufficient thickness to protect the recording film from corrosion and wear at all temperatures up to and including at least 300degrees Celsius.

19. The magnetic storage medium of claim 11, wherein the protective film maintains sufficient density, sufficient hardness, sufficient thickness, and sufficient resistance to corrosion to protect the recording film from corrosion and wear at all temperatures up to and including at least 300degrees Celsius in the presence of oxygen.

20. The magnetic storage medium of claim 11, wherein the protective film has structure, composition, and thickness substantially unchanged over an area of at least 1square meter.

21. The magnetic storage medium of claim 11, wherein the protective film maintains sufficient density, sufficient hardness, sufficient thickness, and sufficient resistance to corrosion to protect the recording film from corrosion and wear at all temperatures up to and including at least 600degrees Celsius, with or without the presence of oxygen.

22. The method of claim 1 wherein fabricating the film comprises fabricating a film that maintains sufficient density, sufficient hardness, sufficient thickness, and sufficient resistance to corrosion to protect the magnetic information storage medium from corrosion and wear at all temperatures up to and including at least 600degrees Celsius, with or without the presence of oxygen.

* * * * *

UNITED STATES PATENT AND TRADEMARK OFFICE
CERTIFICATE OF CORRECTION

PATENT NO. : 9,478,244 B2  
APPLICATION NO. : 14/486397  
DATED : October 25, 2016  
INVENTOR(S) : Robert W. Carpick and Kumar Sridharan Page 1 of 1

It is certified that error appears in the above-identified patent and that said Letters Patent is hereby corrected as shown below:

In the Specification

Column 1, Line 12 GRANT INFORMATION should read:

"This invention was made with government support under DE-FG03-02SF22617, DE-FC07-05ID14675, DE-FG07-05ID14708, DE-FG02-02ER46016 awarded by the US Department of Energy. The government has certain rights in the invention."

Signed and Sealed this  
Third Day of January, 2017

Michelle K. Lee  
*Director of the United States Patent and Trademark Office*